US006271049B1

(12) United States Patent
Auracher et al.

(10) Patent No.: US 6,271,049 B1
(45) Date of Patent: Aug. 7, 2001

(54) METHOD FOR PRODUCING AN OPTOELECTRONIC COMPONENT

(75) Inventors: Franz Auracher, Baierbrunn; Wolfgang Gramann, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/395,303

(22) Filed: Sep. 13, 1999

(30) Foreign Application Priority Data

Sep. 14, 1998 (DE) .............................. 198 42 038

(51) Int. Cl.$^7$ .................................................. H01L 21/00
(52) U.S. Cl. ................ 438/29; 438/22; 438/26; 438/31
(58) Field of Search ................... 438/22, 29, 31, 438/26

(56) References Cited

FOREIGN PATENT DOCUMENTS 0 395 854 A2   11/1990   (EP) .
0 660 467 A1   6/1995    (EP) .

*Primary Examiner*—Long Pham
(74) *Attorney, Agent, or Firm*—Herbert L. Lerner; Laurence A. Greenberg; Werner H. Stemer

(57) ABSTRACT

In a method for producing an optoelectronic component, a laser chip is secured to a semiconductor wafer that is provided with metal structures. Thereafter, for each laser chip, one lens-coupling optical element that deflects the beam path of the laser chip is positioned on the semiconductor wafer. The laser chip is driven, and the space between the laser chip and the lens-coupling optical element is varied and set such that a predetermined beam condition with respect to the location of the optical image plane is met.

13 Claims, 3 Drawing Sheets

METHOD FOR PRODUCING AN OPTOELECTRONIC COMPONENT

BACKGROUND OF THE INVENTION

Field of the Invention

The invention relates to a method for producing an optoelectronic component, having a laser chip as a light emitter and a lens-coupling optical element for the defined projection of the optical beam generated in the laser chip.

Such optoelectronic components are used especially in optical data and communications technology as light emitting components for coupling the laser light generated into a fiber-optic waveguide.

European Patent EP 0 660 467 B1 describes an optoelectronic component that has a silicon substrate, on which the laser chip is mounted. The laser light, emitted by the laser chip parallel to the surface of the silicon substrate, enters a lens-coupling optical element, by which it is deflected 90° and focused. The lens-coupling optical element has a deflection prism, mounted on the substrate, and a laser chip that is present in the beam path behind the deflection prism.

These optoelectronic components are produced by making composite wafers. First, a silicon wafer acting as a common substrate is provided with suitable metal surface structures. After that, spaced-apart, parallel indentations are etched into the silicon wafer. Prism strips of trapezoidal profile are then placed in these indentations and bonded anodically or by soldering techniques. Next, the laser chips are disposed on the silicon wafer at a defined spacing from the prism strips and secured. The separation into separate components (dicing) is done either before or after the mounting of the laser chips, by sawing the silicon wafer apart along parting lines extending transversely to the prism strips. Finally, the laser chips are secured to the individual deflection prisms created by sawing the wafer apart.

This method has the disadvantage that the object distance, that is, the length of the light path between the emitting laser edge and the principal plane of the lens, cannot always be set with the requisite precision. When there is a structurally specified, fixed spacing between the lens and the deflection prism, the object distance is determined by the spacing between the laser chip and the prism strip. It has been demonstrated in practice that this spacing cannot always be preset with the requisite precision using currently available positioning systems. Furthermore, there are production-dictated variations in the focal length of the lenses. To compensate for the unavoidable positional errors of the laser chips, it is therefore necessary, after the positioning step, to individually measure out the spacings between the laser chips and the deflection prisms, as well as the focal lengths of the lenses used, and then to assign the respective laser chip a lens that fits it, in order to attain the desired focusing of the laser beam in a predetermined image plane.

SUMMARY OF THE INVENTION

It is accordingly an object of the invention to provide a method for producing an optoelectronic component, with a laser chip and a lens-coupling optical element that deflects the laser beam, which overcomes the above-mentioned disadvantages of the heretofore-known devices and methods of this general type and which makes an economical production of such components possible.

With the foregoing and other objects in view there is provided, in accordance with the invention, a claim 1.

The object of the invention is attained by a method as defined by claim 1.

In the method of the invention, first the laser chip is placed in a positionally defined way on the semiconductor wafer. The desired object distance is then set by means of an appropriate adjustment of the lens-coupling optical element. To that end, the laser chip is driven, and the lens-coupling optical element is purposefully displaced on the semiconductor wafer until a predetermined beam condition with regard to the location of the focal plane of the optical image is met.

In this way, the desired focal adjustment of the optoelectronic component can be accomplished without measuring out the spacing between the laser chip and the deflection prism and without measuring out the focal lengths of the lenses to be used. A further substantial advantage of the method of the invention is that prefabricated lens-coupling optical elements can be used.

The predetermined beam condition can for instance be that the laser beam leaving the lens-coupling optical element is collimated, or is focused at an image plane that is located at a predetermined spacing from the surface of the semiconductor wafer.

Once the desired position of the lens-coupling optical element relative to the laser chip has been found, the lens-coupling optical element is secured to the semiconductor wafer, or to a portion of ti. The optoelectronic component is then ready for operation.

Cutting the semiconductor wafer apart into individual pieces (substrates), each with a respective laser chip, can be done chronologically before the adjustment (method steps c through f) of the lens-coupling optical elements. However, it is also possible to perform the aforementioned adjustment steps for each lens-coupling optical element while the composite wafer structure is still entire. In that case, the fully adjusted optoelectronic components are separated at the conclusion of the production method, after the lens-coupling optical elements have been secured to the semiconductor wafer (step f).

One expedient possibility for realizing the method of the invention is that securing the laser chip to the wafer (step b) and securing the lens-coupling optical element to the wafer (step d) are done by soldering, and that in the soldering step for securing the lens-coupling optical element, the heat is supplied locally. The local application of heat can be done for instance by means of a laser beam.

If heat is locally supplied, then preferably before the structures are made, a thermal insulation layer and in particular an $SiO_2$ layer is applied to the semiconductor wafer and then regionally removed again at least from the positions intended for the laser chips. The thermal insulation layer reduces the conduction of heat from the heated lens-coupling optical element to the laser chip and therefore acts to counter unsoldering thereof. Since there is no thermal insulation layer underneath the laser chip, good thermal coupling of the laser chip to the semiconductor wafer is still assured.

One preferred procedure, when soldering techniques are used for securing the laser chip and the lens-coupling optical element to the be, is that in the soldering step for securing the lens-coupling optical element a solder coating is used that has a lower melting temperature than the solder coating used to secure the laser chip. This provision, too, is a precaution the laser chip from coming unsoldered during the later soldering of the lens-coupling optical element.

Other especially preferred provisions according to the invention pertain to the production of the lens-coupling optical element used.

In a first, preferred production variant, lenses disposed in rows are embodied on one face of a lens carrier substrate, and the rows are spaced apart by a predetermined row spacing. Independently thereof, parallel-extending grooves are made, disposed at the same row spacing, in a deflection prism substrate, and one longitudinal side face of the grooves is mirror-coated, at least over part of its surface. After that, the lens carrier substrate and the deflection prism substrate are joined together positionally correctly by their faces remote from the lenses and oriented toward the grooves, and the composite structure comprising the lens submount substrate and the deflection prism substrate that has thus been formed is cut apart jointly into the individual lens-coupling optical elements.

The lens-coupling optical elements can also be produced from a single substrate, acting as both a lens submount and a deflection prism submount. In that case, lenses disposed in rows side by side are embodied on a first face of the substrate, and parallel-extending grooves are made on a second face opposite the first face. The rows of lenses and the grooves are each disposed at the same spacing and at a predetermined, fixed relative position to one another. One longitudinal side face of each groove is mirror-coated, at least over part of its surface, and the substrate is then cut apart into the individual lens-coupling optical elements.

If the lens submount substrate or the substrate comprises a monocrystalline material, in particular silicon, then the grooves can preferably be made by a simple anisotropic etching process with respect to a crystallographic orientation of the material, which can be performed economically.

Other features which are considered as characteristic for the invention are set forth in the appended claims.

Although the invention is illustrated and described herein as embodied in a method for producing an optoelectronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3a is a schematic sectional view of a deflection prism substrate with grooves mirror-coated over part of their surface;

FIG. 3b is a plan view of the deflection prism substrate shown in FIG. 3a;

DESCRIPTION OF THE PREFERRED EMBODIMENTS

Figure 1:
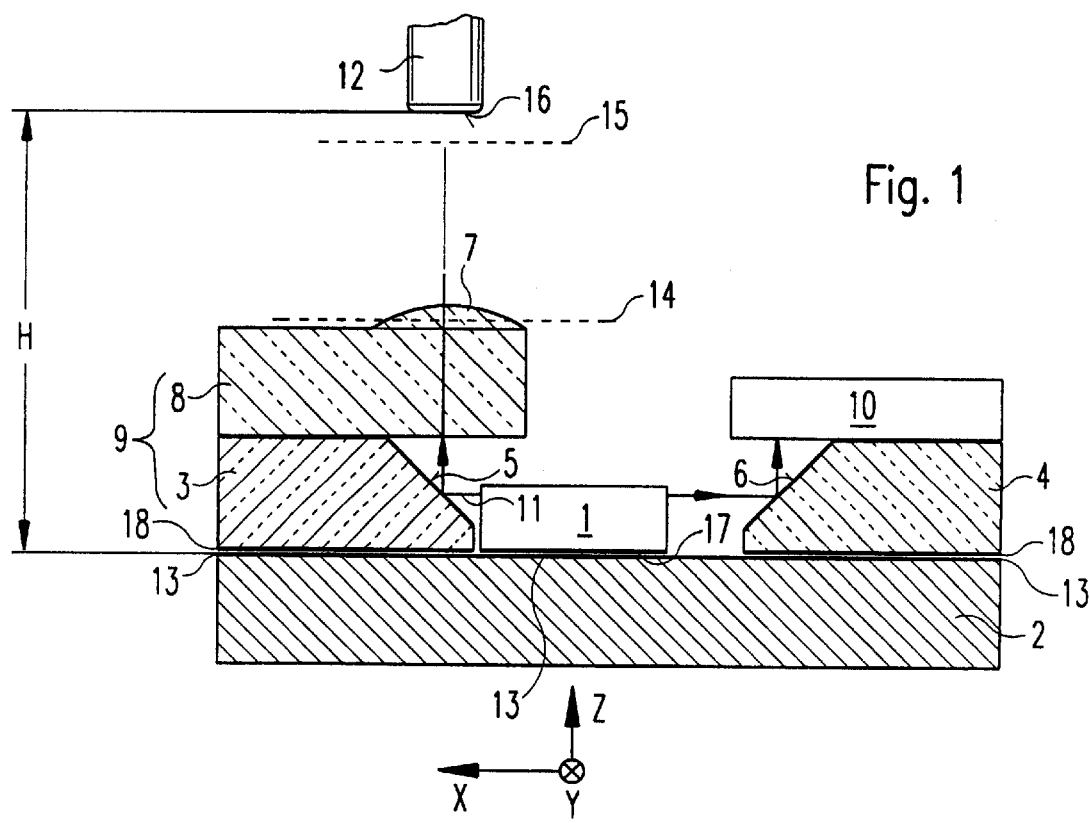
FIG. 1 is a schematic sectional view of an optoelectronic component with single beam deflection.

Referring now to the figures of the drawing in detail and first, particularly, to FIG. 1 thereof, there is seen an optoelectronic component with a laser chip 1 as its light emitter, which is disposed on a preferably silicon submount 2. Located between the submount 2 and the laser chip 1 is a metal layer 13, for instance of gold, which serves to provide the electrical contacting of the bottom of the laser chip 1. The submount 2 also supports two deflection prisms 3, 4, which are disposed on both sides of the laser chip 1. The deflection prisms 3, 4 preferably comprise glass, and each has a mirror face 5, 6 facing toward the laser chip 1. Both mirror faces 5, 6 are oriented at an angle of 45° relative to the active zone of the laser chip 1. A lens 7, preferably integrated with a lens chip 8, is secured to one deflection prism 3.

Laser light 11 emitted in the x-direction by the laser chip 1 on its front side is reflected at the mirror face 5 of the first deflection prism 3 at an angle of 90° in the z-direction and passes through the lens 7 of the lens chip 8.

The first deflection prism 3 and the lens chip 8 with the lens 7 together form a lens-coupling optical element 9, by means of which the laser light 11 emitter is coupled into a fiber-optic waveguide 12, which is fixed at a predetermined height H above the submount 2 on a non-illustrated housing in which the optoelectronic component is installed.

A monitor chip 10 is disposed on the second deflection prism 4. The monitor chip 10 receives laser light that leaves the laser chip 1 at its back side and is deflected by the mirror face 6 of the second deflection prism 4. The monitor chip 10 can be used to measure or regulate the laser power.

A method according to the invention for producing such an optoelectronic component will now be described.

First, in a manner not shown, periodic metal structures (conductor tracks, bond pads) are applied to a semiconductor wafer, in particular an silicon wafer. The metal structures (after being separated from one another) form the metal layer 13 for contacting the bottom side of the laser chips 1.

Next, the semiconductor wafer is equipped with the laser chips 1. To that end, the laser chips 1 are provided on their underside, facing toward the semiconductor wafer, with a solder coating 17 comprising AuSn, AuGe, AuSi, PbSn, or other solderable layers approximately 1 to 10 $\mu 0$ thick, and are soldered to it at a spacing that is predetermined by the periodicity of the metal structure.

In the next step of the production method, the laser chips 1 mounted on the semiconductor wafer are subjected to a joint function text (known as "burn-in"). This text is performed under high-current conditions, so that within a reasonable time the service life of the individual laser chips 1 can be assured.

After the burn-in, the semiconductor wafer is drawn onto an adhesive foil and is cut apart by sawing or breaking into the submounts 2 with the laser chips 1 soldered to them as shown in FIG. 1. The submounts 2 with laser chips 1 on them that are found to be defective in the burn-in are then rejected.

The lens-coupling optical elements 9 are then mounted on the individual submounts 2. In this process the following adjustment steps are performed.

The laser chip 1 is driven and emits laser light 11 that extends parallel to the surface of the submount 2 (that is, in the X-direction). The object distance of the optical image, that is, the sum of the spacings between the emitting laser chip edge and the mirror face 5 as well as between the mirror face 5 and the principal plane 14 of the lens 7 can now be varied by displacing the lens-coupling optical element 9 on the submount 2 in the X-direction. In this process, the set object distance determines the image distance, which is defined as the spacing between the principal plane 14 of the lens 7 and the image plane 15. In the example shown here, the laser light is to be focused onto an end face 16 of the fiber-optic waveguide 12. The adjustment condition in that case is that the spacing of the displaceable lens-coupling optical element 9 relative to the laser chip 1 affixed to the submount is varied and set in such a way that the image plane 15 of the optical image coincides with the plane of the end face 16 of the fiber-optic waveguide 12.

Alternatively, the adjustment condition can be that a collimated laser beam is required in the beam path behind of the lens. In that case, the object distance is set such that the image plane 15 is located at infinity. The object distance is then equivalent to the focal length of the lens 7.

By displacement of the lens-coupling optical element in the Y-direction on the submount 2, the beam direction can be varied in the Z-Y plane. In this way, the focused beam can be positioned, relative to the Y-direction, centrally on the end face 16 of the fiber-optic waveguide 12. Then, however, no influence on the beam focusing that was set in the adjustment step described above can be achieved.

The lens-coupling optical element 9 is then, in the fully adjusted position, secured by laser soldering to the gold metal layer applied to the submount 2. To that end, the underside of the deflection prism 3 is provided with a solder coating 18, which may comprise the same material as the solder coating 17 on the laser chip 1. The laser beam used for supplying heat is aimed in a targeted way at the lens-coupling optical element 9, and the thermal stress on the laser chip can be kept comparatively slight; that is, unsoldering thereof is precluded.

In a manner not shown, in the region under the lens-coupling optical element 9, a thermal insulation layer, for instance of $SiO_2$, may be provided that extends between the submount 2 and the gold metal layer 13.

The bond between the first deflection prism 3 and the lens chip 8 must remain stable during the laser soldering. For this reason, it is done by anodic bonding, for example.

Finally, the unit comprising the second deflection prism 4 and the monitor chip 10 is secured to the submount 2, again by laser soldering. To that end, the second deflection prism 4, on its underside, has for example the same solder coating 18 as the first deflection prism 3. The $SiO_2$ thermal insulation layer, which is optionally present, then also extends under the second deflection prism 4.

Figure 2:
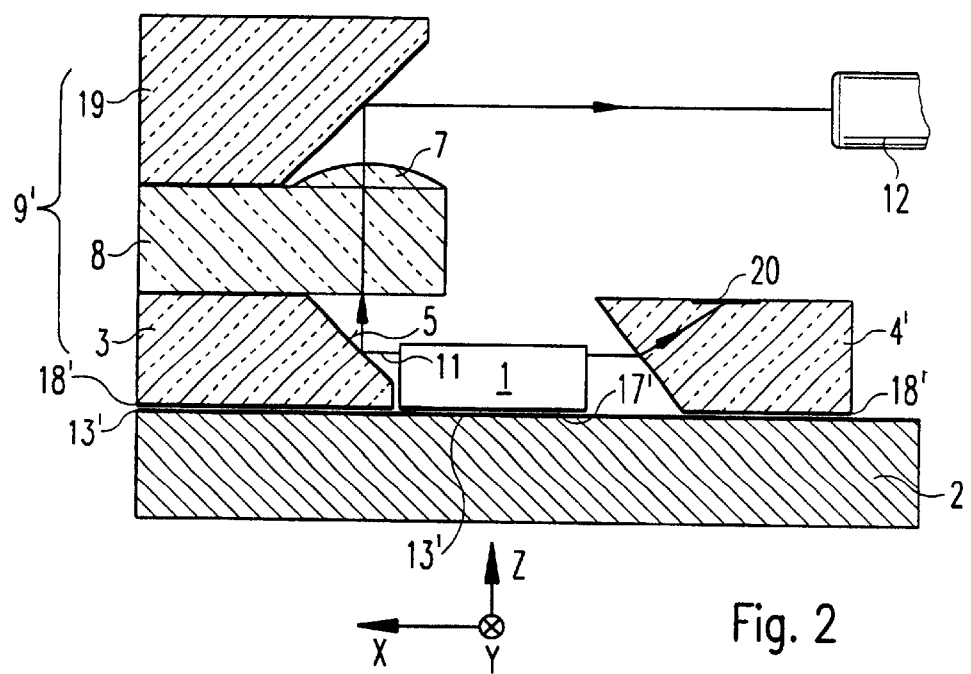
FIG. 2 is a schematic sectional view of an optoelectronic component with double beam deflection.

FIG. 2 serves to explain a variant method in terms of a further optoelectronic component, in which elements equivalent to those in FIG. 1 are identified by the same reference numerals.

The component shown in FIG. 2 differs from the component shown in FIG. 1 essentially in terms of the use of a different metallizing sequence 13', 17', 18' of the submount 2, laser chip 1 and deflection prisms 3, 4'. Also, the lens-coupling optical element 9' used here has one further deflection prism 19 for double beam deflection, and a second deflection prism 4'; with an integrated photo element 20 is used as the monitor chip.

The metal layer 13' of the submount 2 and the solder coatings 18' for the deflection prisms 3, 4' here comprise AuSn. By comparison, gold is alloyed with the solder coating 17' on the underside of the laser chip 1, thus raising its melting temperature. Consequently, a graduation in the soldering temperatures is attained for soldering the laser chip 1, which is done first, and for the later soldering of the lens-coupling optical element 9' and the second deflection prism 4' with the integrated photo element 20. This makes it possible to perform the soldering of the lens-coupling optical element 9' and the second deflection prism 4' at a lower soldering temperature than that used for soldering the laser chip 1. Thus without using a technique of locally supplying heat, the risk of unsoldering of the laser chip 1 is precluded. The soldering of the lens-coupling optical element 9' and the deflection prism 4' can be done jointly in a single process step.

The two variant methods described (locally supplying heat, and graduation of the soldering temperatures) can be combined.

The adjustment of the lens-coupling optical element 9' with double beam deflection is done in the adjustment sequence described in conjunction with FIG. 1.

Figures 3A, 3B:
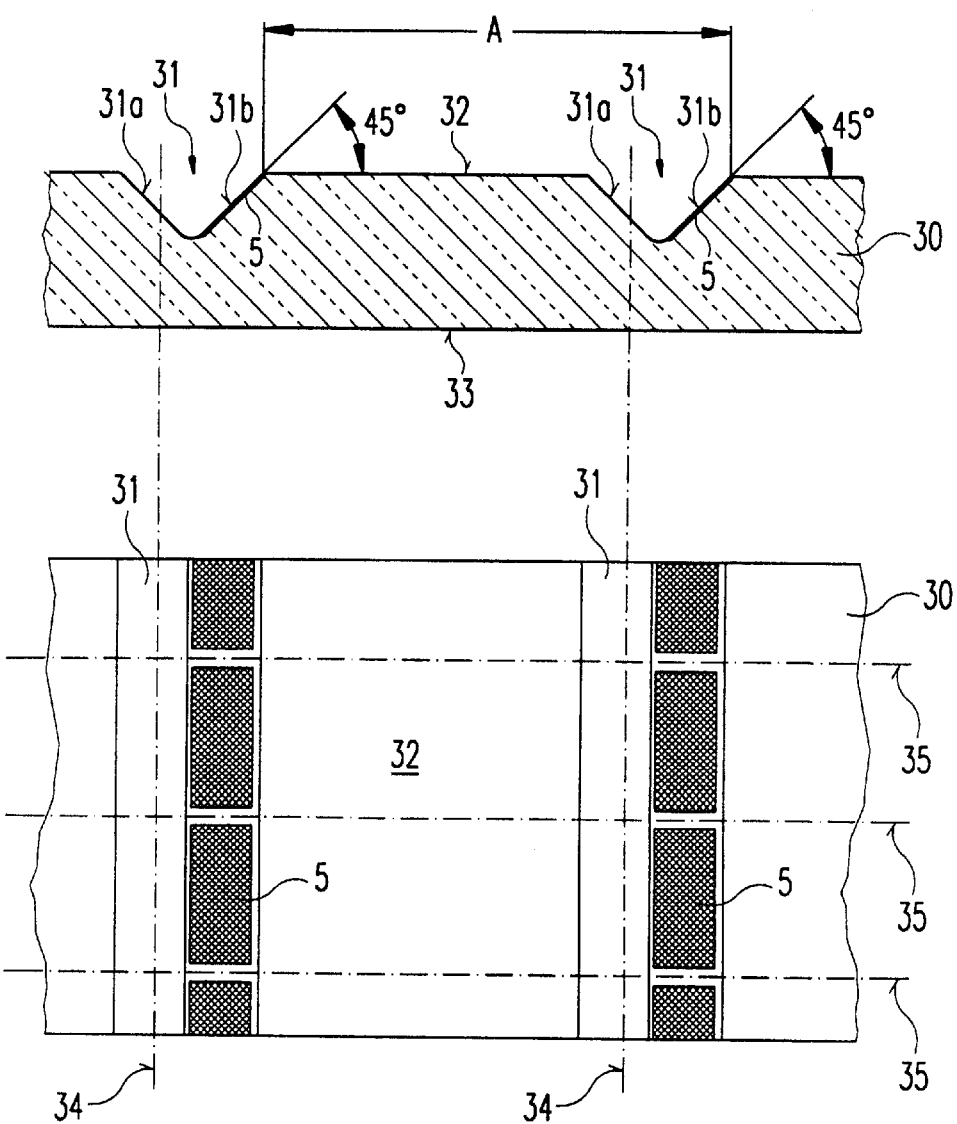

To produce the many lens-coupling optical elements 9, 9', in accordance with FIGS. 3a and 3b, V-shaped grooves 31 extending parallel are made in a deflection prism substrate 30 that is for instance of glass. The grooves 31 are disposed at an equidistant spacing A on a first face 32 of the deflection prism substrate 30.

Each of the grooves has two longitudinal side faces 31a, 31b. At least the longitudinal side face 31b is inclined by an angle of 45 to the first face 32 of the deflection prism substrate 30.

The longitudinal side faces 31b of the grooves 31 are provided with mirror faces 5 (see FIGS. 1 and 2).

On one face of a lens submount substrate (not shown), lenses 7 are formed, disposed in the usual way in rows, side by side. The row spacing is identical to the spacing A of the grooves 31 in the deflection prism substrate 30.

In the next step, the lens submount substrate is placed with its flat face facing away from the lenses on the face 32 of the deflection prism substrate 30 and is oriented such that the grooves 31 extend parallel to the rows of lenses.

After that the lens submount substrate is displaced in some suitable way relative to the deflection prism substrate 30, transversely to the course of the lenses and grooves. In this adjusting process, the beam direction occurring in the lens-coupling optical elements 9, 9' is fixed in the Z-X plane. The adjustment is preferably done such that the emitted laser beam 11, upon reflection by the mirror face 5, passes axially centrally through the lens 7. This adjustment step, too, influences only the beam direction, but not the location of the image plane 15 of the optical image.

After the adjustment, the lens submount substrate and the deflection prism substrate 30 are joined together by an anodic bonding process. If the face 32 of the deflection prism substrate 30 that is intended for the anodic bonding has also been coated in the process of mirror-coating the grooves, then before the bonding the undesired coating must be removed again, by light regrinding or polishing.

After the bonding process, the composite comprising the deflection prism substrate 30 and the lens submount substrate (not shown) is ground to the desired thickness on the face 33, remote from the grooves, of the deflection prism substrate 30, and then is drawn onto an adhesive foil and sawn apart longitudinally and transversely along the respective parting lines 34 and 35. This creates the individual lens-coupling optical elements 9 shown in FIG. 1.

For producing the lens-coupling optical elements 9' with double beam deflection, an analogous procedure may be employed, using a further deflection prism substrate.

Figure 4A:
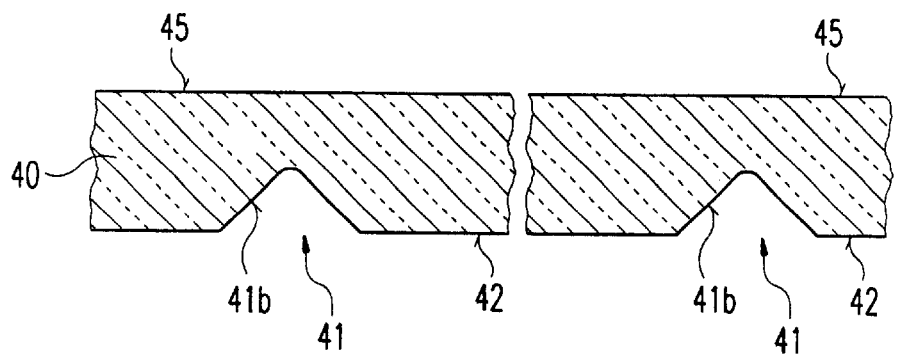
FIG. 4a is a schematic sectional view of a lens submount substrate formed with grooves.
Figure 4B:
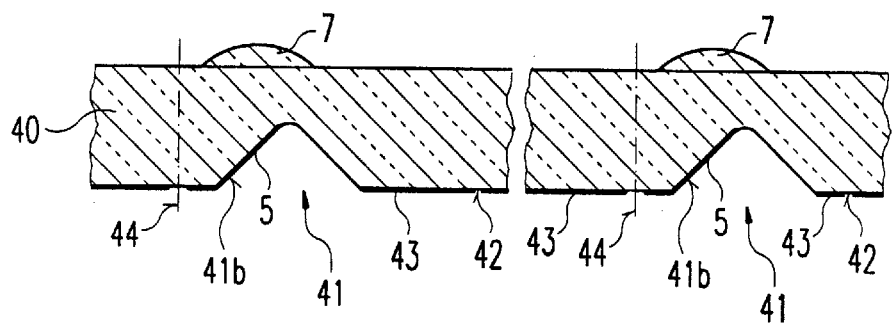
FIG. 4b is a schematic sectional view of the lens submount substrate of FIG. 4a after the lens bodies have been made from it.
Figure 4C:
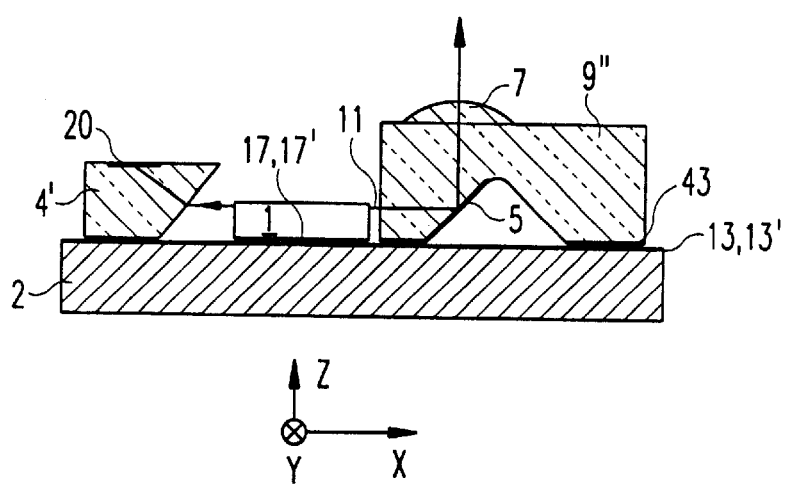
FIG. 4c is a schematic sectional view of an optoelectronic component that uses a lens-coupling optical element made in accordance with FIGS. 4a and 4b.

FIGS. 4a through 4c illustrate a variant method for producing a further lens-coupling optical element 9''. In a substrate 40, for instance of glass or silicon, that is used as a submount for both lenses and deflection prisms simultaneously, grooves 41 extending parallel are made on an underside 42 in the manner described in conjunction with FIG. 3*a*, and then are mirror coated on one longitudinal side face 41*b*. On a top face 45 of the substrate 40, lenses 7 located in rows side by side are then made (see FIG. 4*b*), taking the aforementioned positional relationship (FIGS. 3*a*, 3*b*) into account.

Next, the substrate 40 is provided on its underside 42 with a solder coating 43 corresponding to the solder coatings 18 and 18', is drawn onto an adhesive foil, and is cut apart into individual lens-coupling optical elements 9'' along the parting lines 44 as well as along transversely extending parting lines not shown (but corresponding to the parting lines 35).

FIG. 4*c* shows an optoelectronic component that uses the lens-coupling optical element 9''. Elements corresponding to those in the previous drawing figures are again identified by the same reference numerals. In the manner described above, the lens-coupling optical element 9'' is adjusted relative to the laser chip 1 and soldered to the submount 2. Once again, the deflection prism 4' with the integrated photo element 20 is used as the monitor chip. This embodiment is especially well suited to filling up the gap between the laser diode 1 and the end face of the lens-coupling optical element 9'' with a potting compound, to protect the laser chip 1 against environmental factors, if the optoelectronic component is not installed in a hermetically sealed housing.

We claim:

1. A method of producing an optoelectronic component with a light-emitting laser chip and a lens-coupling optical element for a defined projection of an optical beam generated by the laser chip, the method which comprises:

providing a semiconductor wafer with a metal structure;

electrically contacting and mechanically securing a laser chip to the metal structure and orienting the laser chip with a beam path substantially parallel to the semiconductor wafer;

positioning a lens-coupling optical element on the semiconductor wafer for deflecting the beam path of the laser chip;

driving the laser chip;

varying a spacing between the laser chip and the lens-coupling optical element and setting the spacing such that a deflected laser light leaving the lens-coupling optical element meets a predetermined beam condition with regard to a location of an optical image plane; and securing the lens-coupling optical element in the set position to the semiconductor wafer.

2. The method according to claim 1, wherein the providing step comprises providing the semiconductor wafer with a plurality of structures for receiving a plurality of laser chips, and the securing step comprises securing the lens-coupling optical element on a portion of the semiconductor wafer after dicing thereof.

3. The method according to claim 1 wherein the step of securing the laser chip comprises soldering, and the step of securing the lens-coupling optical element comprises soldering with local heat supply.

4. The method according to claim 1, wherein the step of securing the lens-coupling optical element comprises soldering with local heat supplied by means of a laser beam.

5. The method according to claim 3, which comprises, prior to the providing step, applying a thermal insulation layer to the semiconductor wafer; and removing the thermal insulation layer regionally at least at a position intended for the laser chip.

6. The method according to claim 5, wherein the thermal insulation layer is an $SiO_2$ layer.

7. The method according to claim 1, wherein the steps of securing the laser chip and the step of securing the lens-coupling optical element comprise soldering, and wherein a solder coating is used in the soldering step for securing the lens-coupling optical element having a lower melting temperature than a solder coating used for securing the laser chip.

8. The method according to claim 2, wherein the positioning step for producing the lens-coupling optical elements comprises:

forming lenses in rows on one face of a lens carrier substrate, and spacing the rows apart by a predetermined row spacing;

forming parallel-extending grooves, disposed at the row spacing, in a deflection prism substrate;

mirror-coating a longitudinal side face of the grooves, at least over part of a surface thereof;

joining together the lens carrier substrate and the deflection prism substrate positionally correctly by their faces remote from the lenses and oriented toward the grooves to form a composite structure; and cutting the composite structure comprised of the lens submount substrate and the deflection prism substrate apart jointly into the individual lens-coupling optical elements.

9. The method according to claim 8, wherein one of the deflection prism substrate and the substrate comprises a monocrystalline material, and the grooves are formed by an anisotropic etching process with respect to a crystallographic orientation of the material.

10. The method according to claim 9, wherein the monocrystalline material is silicon.

11. The method according to claim 2, wherein the positioning step for producing the lens-coupling optical elements comprises:

forming lenses in rows side by side on a first face of a substrate, and forming parallel-extending grooves on a second face opposite the first face, disposing the rows of lenses and the grooves at an equal spacing and at a predetermined relative position to one another;

mirror-coating a longitudinal side face of the grooves, at least over part of a surface thereof;

cutting apart the substrate into individual lens-coupling optical elements.

12. The method according to claim 10, wherein one of the deflection prism substrate and the substrate comprises a monocrystalline material, and the grooves are formed by an anisotropic etching process with respect to a crystallographic orientation of the material.

13. The method according to claim 12, wherein the monocrystalline material is silicon.

* * * * *